(12) United States Patent  
Varadarajan

(10) Patent No.: US 9,050,623 B1
(45) Date of Patent: Jun. 9, 2015

(54) PROGRESSIVE UV CURE

(75) Inventor: Bhadri N. Varadarajan, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 1458 days.

(21) Appl. No.: 12/210,060

(22) Filed: Sep. 12, 2008

(51) Int. Cl.
| | | |
|---|---|---|
| *B05D 3/00* | (2006.01) | |
| *B05D 3/06* | (2006.01) | |
| *B05D 3/02* | (2006.01) | |
| *H01L 21/02* | (2006.01) | |
| *B05D 5/12* | (2006.01) | |

(52) U.S. Cl.
CPC ............... *B05D 3/065* (2013.01); *B05D 3/067* (2013.01); *B05D 3/0209* (2013.01); *H01L 21/02318* (2013.01); *B05D 5/12* (2013.01); *H01L 21/02348* (2013.01); *H01L 21/02107* (2013.01); *H01L 21/02225* (2013.01)

(58) Field of Classification Search
CPC ...... B05D 3/065; B05D 3/067; B05D 3/0209; B05D 5/12; H01L 21/02318; H01L 21/02348; H01L 21/02107; H01L 21/02225
USPC .................................................. 427/508, 553
See application file for complete search history.

(56) References Cited

U.S. PATENT DOCUMENTS

| | | | |
|---|---|---|---|
| 3,704,219 A | 11/1972 | McDowell | |
| 3,983,385 A | 9/1976 | Troue | |
| 4,313,969 A | 2/1982 | Matthews et al. | |
| 4,357,451 A | 11/1982 | McDaniel | |
| 4,391,663 A | 7/1983 | Hutter, III | |
| 4,563,589 A | 1/1986 | Scheffer | |
| 4,751,191 A | 6/1988 | Gonsiorawski et al. | |
| 4,837,289 A | 6/1989 | Mueller et al. | |
| 4,885,262 A | 12/1989 | Ting et al. | |
| 4,927,786 A | 5/1990 | Nishida | |
| 4,956,582 A | 9/1990 | Bourassa | |
| 5,174,881 A | 12/1992 | Iwasaki et al. | |
| 5,178,682 A | 1/1993 | Tsukamoto et al. | |
| 5,195,045 A | 3/1993 | Keane et al. | |
| 5,249,076 A | 9/1993 | Fujiwara et al. | |
| 5,268,320 A | 12/1993 | Holler et al. | |
| 5,282,121 A | 1/1994 | Bornhorst et al. | |
| 5,288,684 A | 2/1994 | Yamazaki et al. | |

(Continued)

FOREIGN PATENT DOCUMENTS

| | | |
|---|---|---|
| CN | 1531749 A | 9/2004 |
| CN | 1624895 | 6/2005 |

(Continued)

OTHER PUBLICATIONS

Cho et al., "Plasma Treatments of Molecularly Templated Nanoporous Silica Films," Electrochemical and Solid-State Letters, 4 (4) G35-G38 (2001).

(Continued)

*Primary Examiner* — Robert S Walters, Jr.
(74) *Attorney, Agent, or Firm* — Weaver Austin Villeneuve & Sampson

(57) ABSTRACT

Porous ULK film is cured with UV radiation at progressively shorter wavelengths to obtain ULK films quickly at a desired dielectric constant with improved mechanical properties. At longer wavelengths above about 220 nm or about 240 nm, porogen is removed while minimizing silicon-carbon bond formation. At shorter wavelengths, mechanical properties are improved while dielectric constant increases.

25 Claims, 5 Drawing Sheets

(56) References Cited

U.S. PATENT DOCUMENTS

| | | | |
|---|---|---|---|
| 5,298,939 A | 3/1994 | Swanson et al. |
| 5,300,331 A | 4/1994 | Schaeffer |
| 5,314,538 A | 5/1994 | Maeda et al. |
| 5,364,667 A | 11/1994 | Rhieu |
| 5,407,524 A | 4/1995 | Patrick et al. |
| 5,413,664 A | 5/1995 | Yagi et al. |
| 5,504,042 A | 4/1996 | Cho et al. |
| 5,552,927 A | 9/1996 | Wheatly et al. |
| 5,556,549 A | 9/1996 | Patrick et al. |
| 5,558,717 A | 9/1996 | Zhao et al. |
| 5,582,880 A | 12/1996 | Mochizuki et al. |
| 5,667,592 A | 9/1997 | Boitnott et al. |
| 5,686,054 A | 11/1997 | Barthel et al. |
| 5,700,844 A | 12/1997 | Hedrick et al. |
| 5,734,187 A | 3/1998 | Bohr et al. |
| 5,789,027 A | 8/1998 | Watkins et al. |
| 5,812,403 A | 9/1998 | Fong et al. |
| 5,840,600 A | 11/1998 | Yamazaki et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 6,015,503 A | 1/2000 | Butterbaugh et al. |
| 6,090,442 A | 7/2000 | Klaus et al. |
| 6,098,637 A | 8/2000 | Parke |
| 6,132,814 A | 10/2000 | Livesay et al. |
| 6,136,680 A | 10/2000 | Lai et al. |
| 6,140,252 A | 10/2000 | Cho et al. |
| 6,150,272 A | 11/2000 | Liu et al. |
| 6,228,563 B1 | 5/2001 | Starov et al. |
| 6,232,248 B1 | 5/2001 | Shinriki et al. |
| 6,239,018 B1 | 5/2001 | Liu et al. |
| 6,254,689 B1 | 7/2001 | Meder |
| 6,268,288 B1 | 7/2001 | Hautala et al. |
| 6,270,846 B1 | 8/2001 | Brinker et al. |
| 6,271,273 B1 | 8/2001 | You et al. |
| 6,280,171 B1 | 8/2001 | Buazza |
| 6,284,050 B1 | 9/2001 | Shi et al. |
| 6,288,493 B1 | 9/2001 | Lee et al. |
| 6,290,589 B1 | 9/2001 | Tolles |
| 6,329,017 B1 | 12/2001 | Liu et al. |
| 6,329,062 B1 | 12/2001 | Gaynor |
| 6,333,268 B1 | 12/2001 | Starov et al. |
| 6,340,628 B1 | 1/2002 | Van Cleemput et al. |
| 6,348,407 B1 | 2/2002 | Gupta et al. |
| 6,365,266 B1 | 4/2002 | MacDougall et al. |
| 6,367,412 B1 | 4/2002 | Ramaswamy et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,407,007 B1 | 6/2002 | Tsan et al. |
| 6,420,441 B1 | 7/2002 | Allen et al. |
| 6,444,715 B1 | 9/2002 | Mukherjee et al. |
| 6,467,491 B1 | 10/2002 | Sugiura et al. |
| 6,475,854 B2 | 11/2002 | Narwankar et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,518,130 B1 | 2/2003 | Ohno |
| 6,531,193 B2 | 3/2003 | Fonash et al. |
| 6,534,395 B2 | 3/2003 | Werkhoven et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,566,278 B1 | 5/2003 | Harvey et al. |
| 6,568,346 B2 | 5/2003 | Pu et al. |
| 6,572,252 B1 | 6/2003 | Rangarajan et al. |
| 6,576,300 B1 | 6/2003 | Berry et al. |
| 6,596,467 B2 | 7/2003 | Gallagher et al. |
| 6,596,654 B1 | 7/2003 | Bayman et al. |
| 6,635,575 B1 | 10/2003 | Xia et al. |
| 6,644,786 B1 | 11/2003 | Leben |
| 6,677,251 B1 | 1/2004 | Lu et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,770,866 B2 | 8/2004 | Retschke et al. |
| 6,797,643 B2 | 9/2004 | Rocha-Alvarez et al. |
| 6,800,546 B2 | 10/2004 | Konishi et al. |
| 6,805,801 B1 | 10/2004 | Humayun et al. |
| 6,812,043 B2 | 11/2004 | Bao et al. |
| 6,821,906 B2 | 11/2004 | Wada et al. |
| 6,830,624 B2 | 12/2004 | Janakiraman et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,884,738 B2 | 4/2005 | Asai et al. |
| 6,899,857 B2 | 5/2005 | Pheng et al. |
| 6,902,440 B2 | 6/2005 | Dougan et al. |
| 6,921,727 B2 | 7/2005 | Chiang et al. |
| 6,958,301 B2 | 10/2005 | Kim et al. |
| 6,962,871 B2 | 11/2005 | Lee et al. |
| 6,967,160 B1 | 11/2005 | Paton et al. |
| 7,005,390 B2 | 2/2006 | RamachandraRao et al. |
| 7,017,514 B1 | 3/2006 | Shepherd et al. |
| 7,018,918 B2 | 3/2006 | Kloster et al. |
| 7,025,831 B1 | 4/2006 | Butterbaugh et al. |
| 7,030,041 B2 | 4/2006 | Li et al. |
| 7,094,713 B1 | 8/2006 | Niu et al. |
| 7,097,712 B1 | 8/2006 | Yamazaki et al. |
| 7,112,541 B2 | 9/2006 | Xia et al. |
| 7,132,334 B2 | 11/2006 | Lin |
| 7,144,606 B2 | 12/2006 | Huang |
| 7,148,155 B1 | 12/2006 | Tarafdar et al. |
| 7,166,531 B1 | 1/2007 | van den Hoek et al. |
| 7,169,256 B2 | 1/2007 | Dhindsa et al. |
| 7,176,144 B1 | 2/2007 | Wang et al. |
| 7,195,548 B1 | 3/2007 | Hardikar et al. |
| 7,208,389 B1 | 4/2007 | Tipton et al. |
| 7,235,459 B2 | 6/2007 | Sandhu |
| 7,241,704 B1 | 7/2007 | Wu et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |
| 7,264,676 B2 | 9/2007 | Lai et al. |
| 7,265,061 B1 | 9/2007 | Cho et al. |
| 7,304,302 B1 | 12/2007 | Nunan et al. |
| 7,332,445 B2 | 2/2008 | Lukas et al. |
| 7,381,659 B2 | 6/2008 | Nguyen et al. |
| 7,390,537 B1 | 6/2008 | Wu et al. |
| 7,394,067 B1 | 7/2008 | Soltz et al. |
| 7,402,532 B2 | 7/2008 | Clevenger et al. |
| 7,481,882 B2 | 1/2009 | Won et al. |
| 7,482,265 B2 | 1/2009 | Chen et al. |
| 7,504,663 B2 | 3/2009 | Yamazaki et al. |
| 7,510,982 B1 | 3/2009 | Draeger et al. |
| 7,538,012 B2 | 5/2009 | Ohmi et al. |
| 7,611,757 B1 | 11/2009 | Bandyopadhyay et al. |
| 7,622,162 B1 | 11/2009 | van Schravendijk et al. |
| 7,705,431 B1 | 4/2010 | Sanganeria et al. |
| 7,790,633 B1 | 9/2010 | Tarafdar et al. |
| 7,851,232 B2 * | 12/2010 | van Schravendijk et al. ..... 438/4 |
| 7,858,533 B2 | 12/2010 | Liu et al. |
| 7,906,174 B1 | 3/2011 | Wu et al. |
| 8,043,667 B1 | 10/2011 | Bandyopadhyay et al. |
| 8,062,983 B1 | 11/2011 | Draeger et al. |
| 8,063,983 B2 | 11/2011 | Kotake et al. |
| 8,137,465 B1 | 3/2012 | Shrinivasan et al. |
| 8,211,510 B1 | 7/2012 | Varadarajan et al. |
| 8,242,028 B1 | 8/2012 | Van Schravendijk et al. |
| 8,454,750 B1 | 6/2013 | Shrinivasan et al. |
| 8,465,991 B2 | 6/2013 | Varadarajan et al. |
| 8,512,818 B1 | 8/2013 | Varadarajan et al. |
| 8,629,068 B1 | 1/2014 | Shrinivasan et al. |
| 8,715,788 B1 | 5/2014 | Bandyopadhyay et al. |
| 2001/0001501 A1 | 5/2001 | Lee et al. |

(56) References Cited

U.S. PATENT DOCUMENTS

| | | |
|---|---|---|
| 2001/0014512 A1 | 8/2001 | Lyons et al. |
| 2002/0001973 A1 | 1/2002 | Wu et al. |
| 2002/0015850 A1 | 2/2002 | Nakamura et al. |
| 2002/0016085 A1 | 2/2002 | Huang et al. |
| 2002/0034626 A1 | 3/2002 | Liu et al. |
| 2002/0052124 A1 | 5/2002 | Raaijmakers et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123218 A1 | 9/2002 | Shioya et al. |
| 2002/0123240 A1 | 9/2002 | Gallagher et al. |
| 2002/0148563 A1 | 10/2002 | Carlson et al. |
| 2002/0172766 A1 | 11/2002 | Laxman et al. |
| 2002/0187627 A1 | 12/2002 | Yuang |
| 2002/0195683 A1 | 12/2002 | Kim et al. |
| 2003/0013280 A1 | 1/2003 | Yamanaka |
| 2003/0015764 A1 | 1/2003 | Raaijmakers et al. |
| 2003/0064604 A1 | 4/2003 | Umeda |
| 2003/0064607 A1 | 4/2003 | Leu et al. |
| 2003/0068881 A1 | 4/2003 | Xia et al. |
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0199603 A1 | 10/2003 | Walker et al. |
| 2003/0203321 A1 | 10/2003 | Ma et al. |
| 2003/0227087 A1 | 12/2003 | Kakamu et al. |
| 2003/0228769 A1 | 12/2003 | Chen et al. |
| 2003/0228770 A1 | 12/2003 | Lee et al. |
| 2004/0002617 A1 | 1/2004 | Rantala et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0062633 A1 | 4/2004 | Rice et al. |
| 2004/0069410 A1 | 4/2004 | Moghadam et al. |
| 2004/0072405 A1 | 4/2004 | Yao et al. |
| 2004/0082163 A1 | 4/2004 | Mori et al. |
| 2004/0096593 A1 | 5/2004 | Lukas et al. |
| 2004/0096672 A1 | 5/2004 | Lukas et al. |
| 2004/0099915 A1 | 5/2004 | Takayama et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0115933 A1 | 6/2004 | Jung et al. |
| 2004/0152239 A1 | 8/2004 | Bao et al. |
| 2004/0166240 A1 | 8/2004 | Rhee et al. |
| 2004/0175501 A1 | 9/2004 | Lukas et al. |
| 2004/0175957 A1 | 9/2004 | Lukas et al. |
| 2004/0185679 A1 | 9/2004 | Ott et al. |
| 2004/0221871 A1 | 11/2004 | Fletcher et al. |
| 2004/0224496 A1 | 11/2004 | Cui et al. |
| 2004/0266214 A1 | 12/2004 | Suguro et al. |
| 2005/0016687 A1 | 1/2005 | Shinriki et al. |
| 2005/0025892 A1 | 2/2005 | Satoh et al. |
| 2005/0026454 A1 | 2/2005 | Konishi et al. |
| 2005/0032293 A1 | 2/2005 | Clark et al. |
| 2005/0056369 A1 | 3/2005 | Lai et al. |
| 2005/0064712 A1 | 3/2005 | Andreas |
| 2005/0064726 A1 | 3/2005 | Reid et al. |
| 2005/0079717 A1 | 4/2005 | Savas et al. |
| 2005/0095840 A1 | 5/2005 | Bhanap et al. |
| 2005/0101154 A1 | 5/2005 | Huang |
| 2005/0112282 A1 | 5/2005 | Gordon et al. |
| 2005/0153533 A1 | 7/2005 | Hoshino et al. |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0208758 A1 | 9/2005 | Lu et al. |
| 2005/0233598 A1 | 10/2005 | Jung et al. |
| 2005/0255712 A1 | 11/2005 | Kato et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0264218 A1 | 12/2005 | Dhindsa et al. |
| 2005/0272220 A1 | 12/2005 | Waldfried et al. |
| 2006/0024976 A1 | 2/2006 | Waldfried et al. |
| 2006/0027929 A1 | 2/2006 | Cooney et al. |
| 2006/0046516 A1 | 3/2006 | Weber |
| 2006/0063662 A1 | 3/2006 | Hata et al. |
| 2006/0105106 A1 | 5/2006 | Balseanu et al. |
| 2006/0110936 A1 | 5/2006 | Hill et al. |
| 2006/0118817 A1 | 6/2006 | Haisma |
| 2006/0121208 A1 | 6/2006 | Siegel |
| 2006/0141806 A1 | 6/2006 | Waldfried et al. |
| 2006/0142143 A1 | 6/2006 | Abrevaya et al. |
| 2006/0145304 A1 | 7/2006 | Boyanov et al. |
| 2006/0189133 A1 | 8/2006 | Dimitrakopoulos et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2006/0265868 A1 | 11/2006 | Rueger et al. |
| 2006/0269693 A1 | 11/2006 | Balseanu et al. |
| 2007/0015355 A1 | 1/2007 | Lin et al. |
| 2007/0020940 A1 | 1/2007 | Ohmi et al. |
| 2007/0032024 A1 | 2/2007 | Peidous et al. |
| 2007/0042581 A1 | 2/2007 | Sano et al. |
| 2007/0054504 A1 | 3/2007 | Chen et al. |
| 2007/0065578 A1 | 3/2007 | McDougall et al. |
| 2007/0105292 A1 | 5/2007 | Chen et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0161230 A1 | 7/2007 | Chen et al. |
| 2007/0189961 A1 | 8/2007 | Iacopi et al. |
| 2007/0196011 A1 | 8/2007 | Cox et al. |
| 2007/0196972 A1 | 8/2007 | Shima |
| 2007/0207624 A1 | 9/2007 | Chua |
| 2007/0215377 A1 | 9/2007 | Aoki |
| 2007/0222081 A1 | 9/2007 | Chen et al. |
| 2007/0224824 A1 | 9/2007 | Chen et al. |
| 2007/0228570 A1 | 10/2007 | Dimitrakopoulos et al. |
| 2007/0254204 A1 | 11/2007 | Shin et al. |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0026579 A1 | 1/2008 | Lai et al. |
| 2008/0053615 A1 | 3/2008 | Sago et al. |
| 2008/0132055 A1 | 6/2008 | Nguyen et al. |
| 2008/0199977 A1 | 8/2008 | Weigel et al. |
| 2008/0242118 A1 | 10/2008 | Dimitrakopoulos et al. |
| 2008/0254643 A1 | 10/2008 | Clevenger et al. |
| 2008/0286697 A1 | 11/2008 | Verhaverbeke et al. |
| 2008/0305600 A1 | 12/2008 | Liao et al. |
| 2008/0318437 A1* | 12/2008 | Kim et al. .................... 438/763 |
| 2008/0318438 A1 | 12/2008 | Nakamura et al. |
| 2009/0017640 A1 | 1/2009 | Huh et al. |
| 2009/0039475 A1 | 2/2009 | Shioya |
| 2009/0059406 A1 | 3/2009 | Powers et al. |
| 2009/0207624 A1 | 8/2009 | Ma et al. |
| 2009/0243001 A1 | 10/2009 | Ramkumar et al. |
| 2009/0278116 A1 | 11/2009 | Yamate |
| 2010/0018460 A1 | 1/2010 | Singh et al. |
| 2010/0216303 A1 | 8/2010 | Ohkura |
| 2010/0261349 A1 | 10/2010 | Van Schravendijk et al. |
| 2010/0267231 A1 | 10/2010 | Van Schravendijk et al. |
| 2010/0317198 A1 | 12/2010 | Antonelli et al. |
| 2011/0045610 A1 | 2/2011 | Van Schravendijk et al. |
| 2011/0111533 A1 | 5/2011 | Varadarajan et al. |
| 2011/0117678 A1 | 5/2011 | Varadarajan et al. |
| 2011/0236593 A1 | 9/2011 | Okino et al. |
| 2012/0061718 A1 | 3/2012 | Yamazaki et al. |

(56) References Cited

U.S. PATENT DOCUMENTS

| 2014/0080324 A1 | 3/2014 | Shrinivasan et al. |
|---|---|---|
| 2014/0094038 A1 | 4/2014 | Haverkamp et al. |

FOREIGN PATENT DOCUMENTS

| CN | 101005023 A | 7/2007 |
|---|---|---|
| CN | 102074500 | 5/2011 |
| JP | 62-229833 | 10/1987 |
| JP | 01-107519 | 4/1989 |
| JP | 05-031735 A | 2/1993 |
| JP | 05-138658 A | 6/1993 |
| JP | 09-306892 | 11/1997 |
| JP | 11214364 A | 8/1999 |
| JP | 2001-104776 A | 4/2001 |
| JP | 2006165573 | 6/2006 |
| JP | 2007-508691 | 4/2007 |
| JP | 2007-194582 A | 8/2007 |
| JP | 63-307740 | 12/2008 |
| JP | 2010-103151 | 6/2010 |
| KR | 2000-0043888 | 7/2000 |
| KR | 10-1201039 | 11/2012 |
| TW | 201130045 | 9/2011 |
| TW | 201237959 | 9/2012 |
| WO | 2006/104583 | 10/2006 |
| WO | 2006/127463 | 11/2006 |
| WO | 2007/043206 | 4/2007 |
| WO | WO 2008/156608 | 12/2008 |
| WO | WO 2012/087620 | 6/2012 |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.
Jan, C.H., et al, *90NM Generation, 300mm Wafer Low k ILD/Cu Interconnect Technology*, 2003 IEEE Interconnect Technology Conference.
Gangpadhyay et al., "The First International Surface Cleaning Workshop," Northeastern University, Nov. 11-14, 2002.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
U.S. Office Action mailed Sep. 7, 2004, from U.S. Appl. No. 10/672,311.
U.S. Office Action mailed Dec. 28, 2004, from U.S. Appl. No. 10/672,311.
Peter Singer, "New Materials and Designs to Improve Transistor Performance", Apr. 1, 2004, Semiconductor International.
Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.
U.S. Office Action mailed Mar. 2, 2005, from U.S. Appl. No. 10/860,340.
U.S. Final Office Action mailed Jun. 13, 2005, from U.S. Appl. No. 10/860,340.
Varadarajan et al., "Tensile Dielectric Films Using UV Curing", U.S. Appl. No. 10/972,084, filed Oct. 22, 2004.
Draeger et al., "Creation of Porosity in Low-K Films by Photo-Disassociation of Imbedded Nanoparticles," U.S. Appl. No. 11/146,456, filed Jun. 6, 2005.
Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.
U.S. Final Office Action mailed Jul. 13, 2005, from U.S. Appl. 10/672,311.
U.S. Office Action mailed Dec. 20, 2005, from U.S. Appl. No. 10/672,311.
U.S. Office Action mailed Mar. 29, 2006, from U.S. Appl. No. 10/800,377.
Kelman et al., "Method for Reducing Stress in Porous Dielectric Films", U.S. Appl. No. 11/369,311, filed Mar. 6, 2006.
U.S. Office Action mailed Jun. 28, 2006, from U.S. Appl. No. 10/825,888.
U.S. Office Action mailed Dec. 27, 2006, from U.S. Appl. No. 10/825,888.
Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.
Shrinivasan et al., "Single-Chamber Sequential Curing of Semiconductor Wafers," Novellus Systems, Inc., U.S. Appl. No. 11/115,576, filed Apr. 26, 2005, pp. 1-29.
Kamian et al., "Ultra Violet Light Treatment Load Lock for Dielectric Films," Novellus Systems, Inc., U.S. Appl. No. 11/561,834, filed Nov. 20, 2006, pp. 1-25.
Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.
Vancouver et al., "PECVD Methods for Producing Ultra Low-K Dielectric Films Using UV Treatment," U.S. Appl. No. 11/608,056, filed Dec. 7, 2006, pp. 1-34.
Tarafdar et al., "Sequential Deposition/Anneal Film Densification Method", Novellus Systems, Inc., filed Sep. 11, 2006, U.S. Appl. No. 11/519,445.
Schravendijk, "UV Treatment of FSG Films to Improve Film Stability," Novellus Systems, Inc., U.S. Appl. No. 11/622,423, filed Jan. 11, 2007, pp. 1-31.
Schravendijk, et al., "UV Treatment of STI Films for Stress," Novellus Systems, Inc., U.S. Appl. No. 11/811,048, filed Jun. 7, 2007.
Arghavani et al., *Strain Engineering in Non-Volatile Information Memories, Reed Business Information*, 2007, six pages.
Notice of Allowance and Fee Due mailed May 22, 2006, from U.S. Appl. No. 10/672,311.
Allowed Claims from U.S. Appl. No. 10/672,311.
Notice of Allowance and Fee Due mailed Apr. 4, 2007, from U.S. Appl. No. 10/825,888.
Allowed Claims from U.S. Appl. No. 10/825,888.
Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.
Notice of Allowance and Fee Due mailed Oct. 10, 2006, from U.S. Appl. No. 10/800,377.
Allowed Claims from U.S. Appl. No. 10/800,377.
U.S. Office Action mailed Nov. 28, 2007, from U.S. Appl. No. 10/807,680.
R.J. Lewis, Sr., Hawley's Condensed Chemical Dictionary, $12^{th}$ Edition, Van Nostrad Reinhold Co., New York, 1993 (no month), excerpts pp. 916-918 & 1123-1124.
Notice of Allowance and Fee Due mailed Dec. 20, 2005, from U.S. Appl. No. 10/860,340.
Allowed Claims from U.S. Appl. No. 10/860,340.
U.S. Office Action mailed Oct. 3, 2007, from U.S. Appl. No. 11/115,576.
Shaviv et al., "UV Treatment to Improve Integrity and Performance of Front End Dielectrics," Novellus Systems, Inc., U.S. Appl. No. 11/622,409, filed Jan. 11, 2007.
van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.
Shrinivassan et al., "Multi-Station Sequential Curing of Dielectric Films," Novellus Systems, Inc., U.S. Appl. No. 11/688,695, filed Mar. 20, 2007.
Varadarajan et al., "A Cascaded Cure Approach to Fabricate Highly Tensile Silicon Nitride Films," Novellus Systems, Inc., U.S. Appl. No. 11/897,838, filed Aug. 31, 2007.

(56) References Cited

OTHER PUBLICATIONS

Van den Hoek, et al., "VLSI Fabrication Processes for Introducing Pores Into Dielectric Materials," Novellus Systems, Inc., U.S. Appl. No. 11/606,340, filed Nov. 28, 2006.
U.S. Office Action mailed Jan. 10, 2008, from U.S. Appl. No. 11/622,423.
Bhadri Varadarajan et al., "Development of High Stress SiN Films for Use with Strained Silicon Technologies"; Proc. 68$^{th}$ Symp. On Semiconductors and IC Tech.; Kyoto 2005.
U.S. Office Action mailed Apr. 3, 2008, from U.S. Appl. No. 10/982,654.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 9, 2008, from U.S. Appl. No. 10/982,654.
U.S. Office Action mailed May 14, 2008, from U.S. Appl. No. 11/519,445.
U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 11/824,049, Notice of Allowance mailed Jun. 22, 2009.
U.S. Appl. No. 11/824,049, Allowed Claims.
U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
U.S. Appl. No. 11/115,576, Office Action mailed Apr. 22, 2009.
U.S. Appl. No. 11/688,695, Office Action mailed Jun. 11, 2009.
U.S. Appl. No. 11/696,102, Office Action mailed Jul. 1, 2009.
Yu, J.J. et al., "UV Annealing of Ultrathin Tantalum Oxide Films", Applied Surface Science, V 186 (2002), 57-63.
U.S. Appl. No. 11/811,048, Notice of Allowance mailed Aug. 17, 2009.
U.S. Appl. No. 11/811,048, Allowed Claims.
U.S. Appl. No. 11/369,311, Office Action mailed Aug. 20, 2009.
U.S. Appl. No. 11/608,056, Office Action mailed Aug. 20, 2009.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$—SiH$_4$Llasma", J. Electrochem. Soc., vol. 137 (2) 1990.
Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action mailed Oct. 28, 2008.
U.S. Appl. No. 11/975,473, Office Action mailed Mar. 23, 2009.
Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al., "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/115,576, Office Action mailed Oct. 1, 2009.
U.S. Appl. No. 11/811,048, Notice of Allowance mailed Oct. 8, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Appl. No. 11/519,445, Office Action mailed Nov. 4, 2009.
U.S. Appl. No. 10/972,084, Office Action mailed Nov. 27, 2009.
Haverkamp, et al., "Multi-Station Sequential Curing of Dielectric Films," Novellus Systems, Inc., U.S. Appl. No. 11/977,792, filed Oct. 25, 2007.
U.S. Appl. No. 11/696,102, Final Office Action mailed Dec. 22, 2009.
U.S. Appl. No. 11/369,311, Office Action mailed Jan. 5, 2010.
U.S. Appl. No. 11/688,695, Final Office Action mailed Dec. 31, 2009.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Office Action mailed Feb. 4, 2010.
U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S. Appl. No. 12/172,089, filed Jul. 11, 2008.
U.S. Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-k dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/726,263, "*Apparatus for UV damage repair of low K films prior to copper barrier deposition*", van Schravendijk et al., filed Mar. 17, 2010.
U.S. Appl. No. 11/519,445, Notice of Allowance mailed Apr. 21, 2010.
U.S. Appl. No. 11/561,834, Office Action mailed May 21, 2010.
U.S. Appl. No. 12/840,192, "Sequential deposition / anneal film densification method", Tarafdar et al., filed Jul. 20, 2010.
U.S. Appl. No. 11/688,695, Office Action mailed Jul. 23, 2010.
U.S. Appl. No. 11/590,661, Notice of Allowance mailed Aug. 6, 2010.
U.S. Appl. No. 11/656,661, Final Office Action mailed Aug. 24, 2010.
U.S. Appl. No. 12/172,089, Office Action mailed Sep. 13, 2010.
Li, Shuang et al., "Organic-functionalized pure-silica-zeolite MFI low-*k* films", Chem. Mater. 2005, 17, Mar. 9, 2005, pp. 1851-1854.
U.S. Appl. No. 11/731,581, Final Office Action mailed Sep. 2, 2010.
U.S. Appl. No. 10/972,084, Office Action mailed Oct. 15, 2010.
U.S. Appl. No. 11/977,792, Office Action mailed Oct. 25, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 12/566,514, Office Action mailed Jan. 11, 2011.
U.S. Appl. No. 11/561,834, Final Office Action mailed Dec. 3, 2010.
U.S. Appl. No. 11/696,102, Office Action mailed Jan. 26, 2011.
U.S. Appl. No. 11/688,695, Office Action mailed Feb. 1, 2011.
U.S. Office Action mailed Dec. 12, 2007, from U.S. Appl. No. 11/146,456.
U.S. Final Office Action mailed Jul. 25, 2008, from U.S. Appl. No. 11/146,456.
U.S. Appl. No. 11/146,456, Notice of Allowance mailed Nov. 10, 2008.

(56) References Cited

OTHER PUBLICATIONS

U.S. Appl. No. 11/146,456, Supplemental Notice of Allowance mailed Dec. 15, 2008.
Draeger et al., "Creation of Porosity in Low-K Films by Photo-Disassociation of Imbedded Nanoparticles," U.S. Appl. No. 12/369,384, filed Feb. 11, 2009.
U.S. Office Action mailed Feb. 22, 2011, from U.S. Appl. No. 12/369,384.
U.S. Appl. No. 11/369,311, Office Action mailed Apr. 13, 2011.
U.S. Appl. No. 12/172,089, Final Office Action mailed Apr. 14, 2011.
U.S. Appl. No. 10/972,084, Office Action mailed May 2, 2011.
U.S. Appl. No. 11/656,661, Office Action mailed May 19, 2011.
U.S. Appl. No. 11/731,581, Office Action mailed Jun. 2, 2011.
U.S. Appl. No. 12/646,830, "UV and reducing treatment for K recovery and surface clean in semiconductor processing", Varadarajan et al., filed Dec. 23, 2009.
U.S. Appl. No. 11/977,792, Office Action mailed Jul. 6, 2011.
U.S. Appl. No. 11/897,838, Office Action mailed Jul. 11, 2011.
U.S. Appl. No. 12/646,830, Office Action mailed Jul. 15, 2011.
Notice of Allowance for U.S. Appl. No. 12/566,514, mailed Jul. 13, 2011.
Allowed Claims as of Jul. 13, 2011 for U.S. Appl. No. 12/566,514.
U.S. Appl. No. 11/696,102, Final Office Action mailed Aug. 11, 2011.
Notice of Allowance for U.S. Appl. No. 12/369,384, mailed Aug. 19, 2011.
Allowed Claims as of Aug. 19, 2011 for U.S. Appl. No. 12/369,384.
Korean Notification of Provisional Rejection mailed Dated Jul. 12, 2011 for Application No. 10-2010-0066153.
U.S. Appl. No. 11/369,311, Final Office Action mailed Sep. 29, 2011.
U.S. Appl. No. 12/973,549, Office Action mailed Oct. 11, 2011.
U.S. Appl. No. 11/977,792, Office Action mailed Oct. 24, 2011.
U.S. Appl. No. 10/972,084, Office Action mailed Oct. 27, 2011.
U.S. Appl. No. 11/656,661, Final Office Action mailed Nov. 10, 2011.
U.S. Appl. No. 12/940,324, Office Action mailed Dec. 13, 2011.
U.S. Appl. No. 11/731,581, Office Action mailed Nov. 28, 2011.
U.S. Appl. No. 11/115,576, Notice of Allowance mailed Nov. 14, 2011.
U.S. Appl. No. 12/646,830, Office Action mailed Jan. 11, 2012.
U.S. Appl. No. 11/688,695, Office Action mailed Dec. 14, 2011.
U.S. Appl. No. 12/840,192, Office Action mailed Feb. 6, 2012.
U.S. Appl. No. 13/275,209, Office Action mailed Mar. 12, 2012.
U.S. Appl. No. 11/369,311, Office Action mailed Mar. 7, 2012.
U.S. Appl. No. 11/696,102, Notice of Allowance mailed Feb. 24, 2012.
Allowed Claims as of Feb. 24, 2012 for U.S. Appl. No. 11/696,102.
U.S. Appl. No. 11/897,838, Notice of Allowance mailed Mar. 2, 2012.
Allowed Claims as of Mar. 2, 2012 for U.S. Appl. No. 11/897,838.
Deshmukh, et al., "Remote Plasma Etching Reactors: Modeling and Experiment," J. Vac. Sci. Technol., B 11(2), Mar./Apr. 1993, pp. 206-215.
U.S. Final Office Action dated Jun. 21, 2012 issued in U.S. Appl. No. 11/688,695.
U.S. Notice of Allowance dated Oct. 4, 2012 issued in U.S. Appl. No. 11/688,695.
U.S. Office Action dated Aug. 28, 2012 issued in U.S. Appl. No. 11/731,581.
U.S. Office Action dated May 31, 2012 issued in U.S. Appl. No. 12/726,263.
U.S. Final Office Action dated Sep. 10, 2012 issued in U.S. Appl. No. 12/726,263.
U.S. Office Action, dated Jan. 3, 2013, issued in U.S. Appl. No. 13/487,051.
U.S. Final Office Action dated May 25, 2012 issued in U.S. Appl. No. 12/646,830.
US Office Action dated Jun. 7, 2012 issued in U.S. Appl. No. 12/973,549.
U.S. Office Action dated Jan. 3, 2013 issued in U.S. Appl. No. 12/973,549.
U.S. Final Office Action dated Jul. 19, 2012 issued in U.S. Appl. No. 12/840,192.
U.S. Notice of Allowance dated Sep. 20, 2012 issued in U.S. Appl. No. 12/840,192.
U.S. Office Action dated Jul. 19, 2012 issued in U.S. Appl. No. 11/656,661.
U.S. Final Office Action dated Aug. 15, 2012 issued in U.S. Appl. No. 13/275,209.
U.S. Final Office Action dated May 1, 2012 issued in U.S. Appl. No. 10/972,084.
U.S. Office Action dated Oct. 5, 2012 issued in U.S. Appl. No. 10/972,084.
U.S. Final Office Action dated Jul. 31, 2012 issued in U.S. Appl. No. 11/369,311.
Korean Notification of Provisional Rejection dated Mar. 26, 2012 issued in Appl. No. 10-2010-0066153.
SG patent application No. 2010079747 Examination Report mailed Apr. 25, 2012.
PCT International Search Report and Written Opinion dated Dec. 26, 2012, issued in WO Patent Application No. PCT/US2011/064246.
Shrinivassan et al., "Multi-Station Sequential Curing of Dielectric Films," U.S. Appl. No. 14/086,732, filed Nov. 21, 2013.
Varadarajan et al., "A Cascaded Cure Approach to Fabricate Highly Tensile Silicon Nitride Films," Novellus Systems, Inc., U.S. Appl. No. 13/487,051, filed Jun. 1, 2012.
US Office Action (Supplemental), dated Jan. 10, 2006, issued in U.S. Appl. No. 10/672,311.
U.S. Office Action dated Jul. 25, 2013 issued in U.S. Appl. No. 13/275,209.
U.S. Notice of Allowance dated Jan. 9, 2014 issued in U.S. Appl. No. 13/275,209.
U.S. Final Office Action dated Jan. 30, 2013 issued in U.S. Appl. No. 11/656,661.
U.S. Notice of Allowance dated May 3, 2010 issued in U.S. Appl. No. 11/519,445.
U.S. Office Action dated Mar. 15, 2013 issued in U.S. Appl. No. 12/840,192.
U.S. Final Office Action dated May 22, 2013 issued in U.S. Appl. No. 10/972,084.
U.S. Final Office Action dated Aug. 8, 2013 issued in U.S. Appl. No. 10/972,084.
U.S. Examiner's Answer to Appeal Brief (filed Nov. 20, 2013) Before the Patent Trial and Appeal Board on Mar. 13, 2014 issued in U.S. Appl. No. 10/972,084.
U.S. 2nd or Subsequent Examiner's Answer to Appeal Brief (filed Nov. 20, 2013) Before the Patent Trial and Appeal Board on Apr. 2, 2014 issued in U.S. Appl. No. 10/972,084.
U.S. Office Action dated Jun. 11, 2013 issued in U.S. Appl. No. 11/369,311.
U.S. Final Office Action dated Oct. 25, 2013 issued in U.S. Appl. No. 11/369,311.
U.S. Office Action dated Mar. 17, 2014 issued in U.S. Appl. No. 11/369,311.
U.S. Notice of Allowance dated Jul. 17, 2014 issued in U.S. Appl. No. 11/369,311.
U.S. Notice of Allowance dated Feb. 14, 2013 issued in U.S. Appl. No. 11/688,695.
U.S. Office Action dated Jul. 19, 2013 issued in U.S. Appl. No. 13/886,694.
U.S. Notice of Allowance dated Sep. 12, 2013 issued in U.S. Appl. No. 13/886,694.
U.S. Office Action dated Feb. 25, 2014 issued in U.S. Appl. No. 11/977,792.
U.S. Final Office Action dated Jun. 14, 2013 issued in U.S. Appl. No. 11/731,581.
U.S. Office Action dated Mar. 31, 2014 issued in U.S. Appl. No. 14/026,894.
U.S. Office Action dated Mar. 6, 2013, issued in U.S. Appl. No. 12/726,263.
U.S. Final Office Action, dated Aug. 7, 2013, issued in U.S. Appl. No. 12/726,263.

(56) References Cited

OTHER PUBLICATIONS

U.S. Notice of Allowance, dated Apr. 22, 2013, issued in U.S. Appl. No. 13/487,051.
U.S. Office Action dated Mar. 6, 2013 issued in U.S. Appl. No. 12/646,830.
U.S. Final Office Action dated Jul. 30, 2013 issued in U.S. Appl. No. 12/646,830.
U.S. Office Action dated Feb. 20, 2014 issued in U.S. Appl. No. 12/646,830.
U.S. Notice of Allowance dated Feb. 22, 2013 issued in U.S. Appl. No. 12/973,549.
Chinese Office Action dated Jan. 14, 2013 issued in Appl. No. 201010539625.7.
Chinese Second Office Action dated Sep. 10, 2013 issued in Appl. No. 201010539625.7.
Chinese Third Office Action dated May 23, 2014 issued in Appl. No. 201010539625.7.
Taiwan Office Action dated Mar. 27, 2013 issued in Application No. 099123184.
PCT International Preliminary Report on Patentability and Written Opinion dated Jul. 4, 2013, issued in PCT/US2011/064246.
Korean Office Action dated Sep. 26, 2013, issued in KR 2013-7019282.
Korean Second Office Action dated Dec. 5, 2013, issued in KR 2013-7019282.
Taiwan Search Report dated Aug. 20, 2013 issued in TW 100147212.

\* cited by examiner

PROGRESSIVE UV CURE

FIELD OF THE INVENTION

This invention relates to methods for forming thin films. More specifically, the invention relates to forming an ultra-low k (ULK) film with desirable mechanical properties.

BACKGROUND

Many layers of dielectric films are used to make an integrated circuit. IC manufacturing requires dielectric films to have certain properties in order for the circuit to function as designed. For example, there is a general need for materials with low dielectric constants (low-k). Using low-k materials as the intermetal dielectric (i.e., the layer of insulator separating consecutive levels of the conductive metal interconnects) reduces the delay in signal propagation due to capacitive effects, otherwise know as the RC delay. A dielectric material of low dielectric constant will have low capacitance, and hence the RC delay of an IC constructed with such a material will be lower as well.

In addition to low dielectric constants, certain material properties may be specified. The semiconductor manufacturing processes, with all the temperature changes, mechanical polishing, cutting, and packaging, impose a lot of stress onto the semiconductor. To avoid premature device failure, the film should not be damaged by subsequent manufacturing process. Some devices may specify a certain hardness, for example.

As another example, there is a general need for materials with specific tensile or compressive stresses. A layer of tensile material may be used between compressive material to reduce or avoid wafer warping. These and other properties may be met on the film as deposited, or after treatment.

One such treatment may be a thermal process in which the substrate is heated to a temperature for a time. A thermal treatment may remove unwanted particles from the film, or change its stresses or other properties. These thermal processes, however, have certain difficulties. In particular, substrate temperatures generally need to be high (i.e., greater than about 400 or 500 degrees Celsius or much higher) with exposure times typically on the order of many hours. The long exposure time may be unsuitable for mass manufacturing. These conditions may also damage copper containing devices, especially in when a low-k dielectric is being cured. Also, the use of temperature sensitive materials may limit the temperature and or duration of exposure, e.g., nickel silicide precludes inducing film stress by using temperatures above 400° C. and some SiN films allow a cure temperature up to 480° C.

To overcome these disadvantages of thermal processing, another technique has been developed, which involves exposing the film to UV radiation. Irradiation of the low-k permits modulation of desired film properties such as dielectric constant or film stress at lower temperatures. The film properties obtained are strongly affected by the UV curing process and conditions.

What are needed therefore are improved methods and devices for treating dielectric films with UV radiation to obtain desired film properties.

SUMMARY

The present invention addresses this need by providing improved methods to treat dielectric films with UV radiation. Particularly, the present invention addresses UV curing of ultra low-k (ULK) films on a substrate. Better mechanical property with same or a lower dielectric constant (compared to a standard cure) is achieved by curing at progressively shorter wavelengths and cure conditions designed to favor particular reaction mechanisms. A first exposure at wavelengths longer than about 220 nm or about 240 nm removes porogen while minimizing silicon-carbon bond formation and methyl group removal. It also enables us to achieve a lower dielectric constant after the first stage of cure. A second exposure at shorter wavelengths increases the mechanical properties to the desired level, with the dielectric constant also increasing at the same time.

Ultra low-k film is currently achieved by introducing pores into the dielectric film. A film of structure former is deposited with porogens, typically hydrocarbon molecules that are subsequently removed. The structure former, left with pores, becomes what is known as the backbone. More pores and more certain hydrocarbon content in the backbone mean lower dielectric constant in the film. Thus, a lower k value is achieved by depositing and removing more porogen while keeping more methyl groups in the backbone. However, a more porous film may be also weaker and is more likely damaged in subsequent semiconductor processing. In addition to a low-k value, a film may also need to meet a minimum amount of hardness or other mechanical properties. It is believed that the lower dielectric constant and desirable mechanical properties are related and constrain each other. For example, for a given film, increasing hardness would cause some corresponding increase in dielectric constant, and a decrease in dielectric constant would cause some decrease in hardness.

The present invention pertains to methods of UV curing that maximizes desirable mechanical properties for a given dielectric constant. In one aspect, the present invention pertains to methods of exposing a film sequentially to a first and a second UV radiation. The first UV radiation has only wavelengths that are longer than about 220 nm or about 240 nm, preferably including wavelengths that are very close to 240 nm. The first UV radiation may consist entirely of radiation in the UVC region of about 220-280 nm. The first UV exposure occurs until a dielectric constant of the film starts to increase. The second UV radiation has only wavelengths of 185 nm or longer, preferably including wavelengths very close to 185 nm. The second UV exposure occurs until a desired film material property is reached. A shorter cure time is achieved exposing the film to UV radiation as close as to the cut-off wavelength without crossing the boundary. The desired film property may be hardness, elastic modulus, or fracture resistance.

During the first UV exposure, porogen outgassing and silicon-oxygen cross-linking is promoted. The porogen outgassing process is believed to reduce the dielectric constant of the film by making the film more porous. The silicon-oxygen cross-linking process is believed to repair the ULK film with removed porogen. During the first exposure, the substrate temperature may be equal or higher than the substrate temperature during the second exposure. The substrate temperature during the first exposure may be 380° C., 400° C., or above 425° C. The first and second UV exposure may occur in the same chamber. For multi-station chambers, the first and second UV exposure may occur in a same wafer exposure or different wafer exposure areas.

According to various embodiments of the present invention, the final film hardness for the same film dielectric constant may be up to 24% higher than a film exposed to a UV radiation of a broad spectrum achieving the same final film dielectric constant. Comparing films achieving the same hardness, the final film dielectric constant may be up to about 3% lower for a film treated with methods of various embodiments of the present invention than a film exposed to a UV radiation of a broad spectrum.

In another aspect, the present invention pertains to a method of UV curing a ULK film by exposing the film to a first and a second UV radiation. The first UV radiation exposure is configured to outgas porogens from the film and link silicon-oxygen bonds while minimizing formation of silicon-carbon bonds. The second UV radiation exposure is configured to link silicon-carbon bonds. During the first exposure, the substrate temperature may be equal or higher than the substrate temperature during the second exposure. The substrate temperature during the first exposure may be 380° C., 400° C., or above 425° C.

In yet another aspect, the present invention pertains to a method determining UV curing parameters for an ULK film. ULK film is deposited on a number of substrates. Each substrate is exposed to a first UV radiation having only wavelengths longer than about 240 nm, preferably including wavelengths between 240-260 nm, for different durations from 1 to 20 minutes. Depending on the number of substrates used, the first exposure duration may vary by two minutes or three minutes, for example, for each substrate. For example, five different substrates may be used to UV cure at 2 minute, 5 minutes, 8 minutes, 11 minutes, 14 minutes, and 18 minutes. The dielectric constant and one or more material property for each substrate are measured. The first duration corresponding to the lowest dielectric constant and optionally the maximum or minimum material property, e.g., maximum hardness, is selected. These operations may be repeated with different exposure durations so as to narrow down to the best parameters. To determine the second exposure duration, a plurality of substrates that were previously exposed to the first UV radiation for a first duration are exposed to a second UV radiation for different durations from 1 to 20 minutes. The second duration includes only wavelengths of 185 nm or longer and preferably includes wavelengths close to 185 nm. The dielectric constant and one or more material property are measured for each substrate. Depending on the desired final film property, a second duration is determined based on the duration at which a target k value or a desired film property, e.g., hardness, is reached. In one example, if a specific hardness is desired, the second duration is selected based on the exposure duration of the substrate achieving a measured hardness closest to the desired value.

In yet another aspect, the method of the present invention pertains to a ULK UV cure process optimized for shortest cure time by first exposing the film to a first radiation having only wavelengths longer than about 220 nm or 240 nm, preferably including wavelengths close to 240 nm and then exposing the film to a second UV radiation comprising wavelengths of less than 185 nm until a desirable material property, e.g., a minimum hardness, is reached. The first exposure occurs until the dielectric constant of the film starts to increase. Note that with this method, the final dielectric constant of the film may not be the minimum dielectric constant.

These and other features and advantages of the invention will be described in more detail below with reference to the associated drawings.

DETAILED DESCRIPTION OF A PREFERRED EMBODIMENT

Introduction

Figure 1:
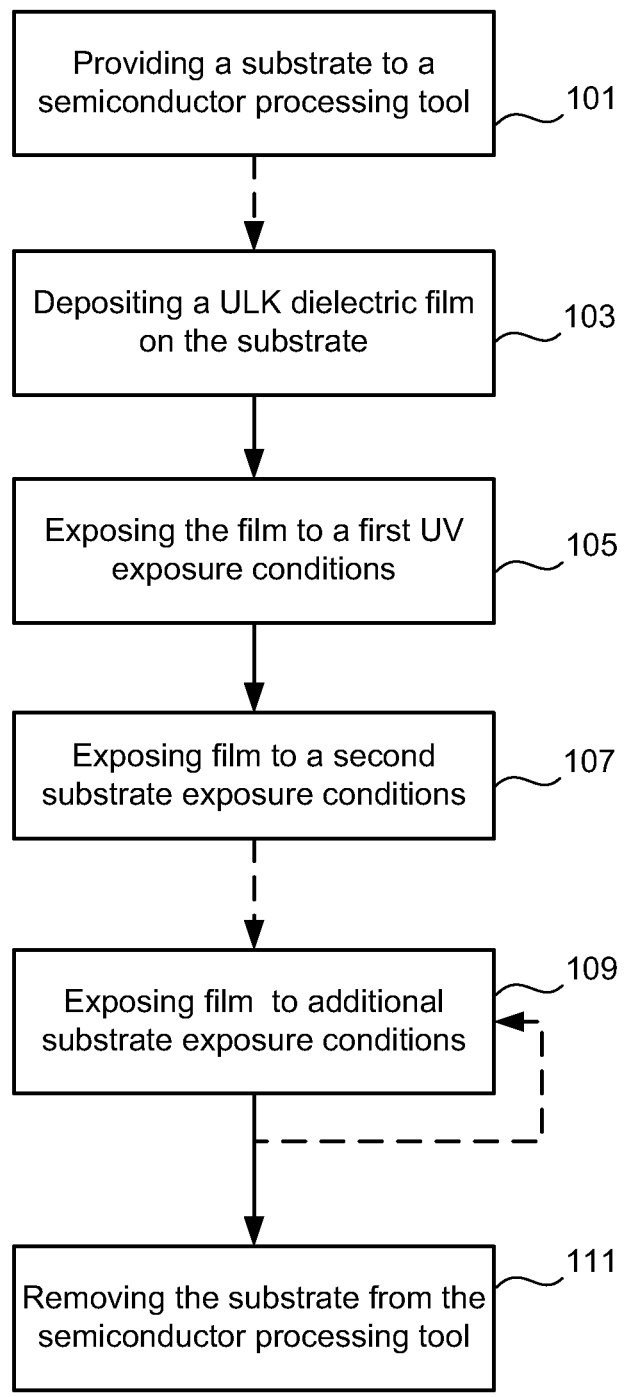
FIG. 1 is a flowchart summarizing stages of a general process in accordance with the present invention.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Reference will be made in detail to implementations of the present invention as illustrated in the accompanying drawings. The same reference indicators will be used throughout the drawings and the following detailed description to refer to the same or like parts. In this application, the terms "work piece," "wafer" and "substrate" will be used interchangeably. The following detailed description assumes the invention is implemented on a wafer. However, the invention is not so limited. The work piece may be of various shapes, sizes, and materials (e.g., displays of various sizes).

The present invention involves a single-station or multi-station semiconductor processing chamber. Each station has a wafer support and a radiation source. The radiation source has one or more light generators and one or more optical components. The radiation intensity and the wavelength output of the radiation source may be independently controlled at each station. The wafer support temperature and gas flow may also be independently controlled at each station. In certain embodiments, the present invention pertains to a semiconductor processing tool having at least one substrate processing station in a chamber and capable of independently control radiation intensity, radiation wavelengths, and substrate temperature at each station. In other embodiments, these independently controlled radiation conditions may be applied by different light generators that can sequentially or concurrently cure wafers.

The present invention also involves processes to prepare and/or cure dielectric films on substrates by exposure to UV radiation. Effects of exposure to UV radiation or UV curing may include increased stress of the materials, increased cross-linking of the bonds of the material and densification of the material. UV radiation is used to remove porogen from a precursor layer containing a porogen and structure former or backbone, thereby forming a porous dielectric film with a low dielectric constant. It is often desirable to modulate one or more of these effects in preference to one another—for example, in preparing porous low-k films from precursor layers, it may be desirable to remove porogen from a precursor layer and strengthen the backbone without causing the film thickness to shrink, and thereby causing a concomitant increase in stress. Further, in the case of porous low-k films, it may be desirable to remove the porogen from the film before certain types of cross-linking. However, these reaction mechanisms often occur at the same time when a film is exposed to a UV radiation.

Conventional UV curing processes use a single processing condition, e.g. 100% UV intensity and a broad spectrum and temperature of 400° C., that may be suitable for one or some of the effects listed above but may also undesirably affect one of the other effects listed above.

UV curing is used to drive out porogen from composite porogen-CDO films, leaving a porous CDO matrix with a low k-value, generally between 2.0 and 2.6. In particular embodiments, the methods of the present invention are used to prepare dielectric films from precursor films or layers that contain a structure former and a porogen. The structure former serves as a backbone of a porous network, and the porogen generates the porous regions within the porous network. The methods involve a multiple operation UV cure process in which different reaction mechanisms are either promoted or suppressed.

FIG. 1 is a flow chart depicting generic operations in accordance with the present invention. Initially, a substrate is provided to a semiconductor processing tool (101). This substrate may or may not have a film deposited on it that will be the subject of the UV treatment. If the substrate does not include the film to be treated, an optional step would be to deposit such film onto the substrate (103). This deposition may be performed in a separate chamber or in a first station of a multi-station chamber. Based on the type of film to be treated and processing to be achieved, the film is then exposed to a first UV radiation under a first set of exposure conditions (105). The UV radiation may have a specific radiation intensity, spectral distribution, and radiation wavelength(s) (either a single wavelength may be used or a spectrum or a range of wavelengths). These conditions may be substrate temperature or gas flow. These conditions may be controlled independently from each other from operation to operation. In a second operation, the film is exposed to a second UV radiation at a second set of conditions (107). Typically at least one of these conditions will be different from operation to operation, and additional operations may be used to vary one or more of these conditions (109). An operation may include transferring the substrate between stations, so that the same operation is performed at more than one station, but under the same conditions. In some instances, more than one operation may be performed at one station. The more than one operation may be performed serially, such as pulsed UV exposure in two intensities. The more than one operation may also be performed concurrently, such as UV exposure from two light sources having different intensities and spectral distributions. In some cases, one operation may start before another ends such that only a portion of the operations overlaps each other.

Certain embodiments of the present invention involve depositing onto a substrate the film to be irradiated. Different types of film may be deposited, depending on process requirements. One such film is the ultra low-k dielectric film. A precursor film or layer that contains a "structure former", typically a dielectric material, is deposited with a porogen, which generates the porous regions within the dielectric material. In a method of this invention, the porogen is removed from the precursor film to create a porous low-k dielectric layer. Within the precursor film, the porogen resides in locations that will subsequently become void locations in the final dielectric film. Discussion of method of forming the precursor film may be found in U.S. patent application Ser. No. 11/369,311, filed on Mar. 6, 2006, titled "Method For Reducing Stress In Porous Dielectric Films," the disclosure of which is herein incorporated by reference in its entirety for all purposes.

Reaction Mechanisms

A number of reaction mechanisms occur during UV radiation of ULK films. By studying changes in film chemistry after UV curing with different UV spectrum bulbs and filters, a number of reaction mechanisms are found as shown in Table 1. Fourier Transform Infrared Spectroscopy (FTIR) was used to determine film chemistry before and after UV radiation. Various reaction mechanisms were correlated to the different UV spectrums.

Generally, a minimum amount of photon energy is required for a reaction to occur substantially. For example, a photochemical reaction requiring high energy photons is much less likely to occur if only low energy photons are used. However, if only high energy photon radiation is used, all reactions may occur at once and in some cases occur in undesirable order or occur in undesirable rates. Thus, investigation of the different reaction mechanisms and how they are affected by different UV spectrums allow fine-tuned process control over these reactions. As used herein, a UV spectrum promotes a reaction if an exposure of UV radiation in the spectrum increases the reaction rate relative to other possible reactions.

TABLE 1

| Reaction mechanisms for UV cure of ULK films | |
|---|---|
| Porogen breakdown and out-diffusion | (1) |
| Si—OH + HO—Si → Si—O—Si + $H_2O$ | (2) |
| Si—OH + H—Si → Si—O—Si + $H_2$ | (3) |
| Si—$CH_3$ + HO—Si → Si—O—Si + $CH_4$ | (4) |
| Si—$CH_3$ + H—Si → Si—$CH_2$—Si + $H_2$ | (5) |
| Si—$CH_3$ + $H_3$C—Si → Si—C—C—Si + $3H_2$ | (6) |
| Si—$CH_3$ + $H_3$C—Si → Si—$CH_2$—Si + $CH_4$ | (7) |
| Si—$CH_3$ + $H_2$ → Si—H + $CH_4$ | (8) |

The first reaction is porogen breakdown and out-diffusion. Porogen is usually a hydrocarbon, e.g., an aldehyde, alkene, ester, di-ter-butyl silane, terpene and derivatives. In the first reaction, porogen is reacted to form one or more byproducts that are removed easily. UV radiation alone or UV radiation with oxidizing gas is used to breakdown the porogen into volatile or easily diffused-out products. Medium to lower energy UV photons are used for this reaction. UV radiation having wavelengths of shorter than about 270 nm, 250-270 nm, or longer than about 240 nm are believed to promote this reaction. Note that at shorter UV radiation wavelengths (higher energy), this reaction also occurs, but competing reactions in the film may reduce the ability for the porogen to diffuse out of the film. Thus radiation at shorter wavelengths does not promote the reaction above others. As the porogen is removed and the porosity increases in the film, the dielectric constant of the film goes down. The remaining structure former may be damaged and weak. Usually some treatment is required before the film can withstand subsequent semiconductor processing.

The rate of diffusion may also be promoted by changing the substrate temperature. Generally, the rate of diffusion is higher with higher substrate temperature. However, too high a temperature may cause undesirable reactions or reduce the remaining thermal budget. Substrate temperatures of up to about 400° C. may be maintained without draining the thermal budget while promoting diffusion.

Reactions 2 to 4 involve oxygen-based cross linking. In each case a silicon-oxygen-silicon (Si—O—Si) bond is formed, with different by-products. These reactions involve silanols as reactants. As the silanol in the film becomes depleted, these reactions also slow down. The oxygen-based cross linking reactions also requires medium energy photons. UV radiation having wavelengths of shorter than about 240 nm, 225-240 nm, or longer than about 225 nm are found to promote this reaction. It is believed these reactions repair the film after the porogen is removed and further decreases the dielectric constant by removing silanols. These reactions may also densify the film, increase hardness and elastic modulus.

Reactions 5 and 6 involve carbon cross-linking. Particularly, these reactions involve breaking the carbon-hydrogen bond. These carbon-based cross linking reactions also requires medium energy photons. UV radiation having wavelengths of shorter than about 240 nm, 225-240 nm, or longer than about 225 nm are found to promote this reaction. It is believed these reactions strengthen and harden the film, but also at the same time increase the dielectric constant of the film. Note that reactions 5 and 6 compete with reactions 2 to 4. These reactions are promoted in the same UV spectrum so the effect on the dielectric constant may be offset initially or even slightly decrease. As the radiation continues the amount of remaining silanol declines and reactions 5 and 6 will dominate, which tends to increase the dielectric constant.

Reaction 7 is another carbon cross-linking reaction. This reaction requires breaking the silicon-methyl (Si—CH$_3$) bond and occurs predominately with high energy photons at wavelengths shorter than about 200 nm. UV radiation having wavelengths of shorter than about 220 nm, 180-225 nm, or shorter than about 200 nm are found to promote this reaction. It is believed this reaction also strengthens and hardens the film, but also at the same time increases the dielectric constant of the film.

Reaction 8 is also a reaction that causes carbon loss without concomitant improvement in mechanical properties, since it does not lead to cross-linking. This reaction also requires breaking the silicon-methyl (Si—CH$_3$) bond and occurs predominately with high energy photons at wavelengths shorter than about 200 nm. This reaction removes a methyl group and leaves a silicon-hydrogen bond behind. A reduction in the number of silicon-methyl bonds increases the dielectric constant. If the increase in dielectric constant is associated with concomitant desirable increases in hardness required to integrate the film, e.g., reaction 7, then the increase is tolerated. However, it is believed that this reaction increases tensile stress and the dielectric constant of the film without increasing the hardness or other desirable properties. Therefore, this reaction should be avoided. Further, consumption of methyl groups or a reduction of backbone content can lead to integration issues because the film hydrophobicity is reduced. A reduction in hydrophobicity can increase the likelihood of etch damage and a loss of critical dimension during wet treatment.

Figure 2:
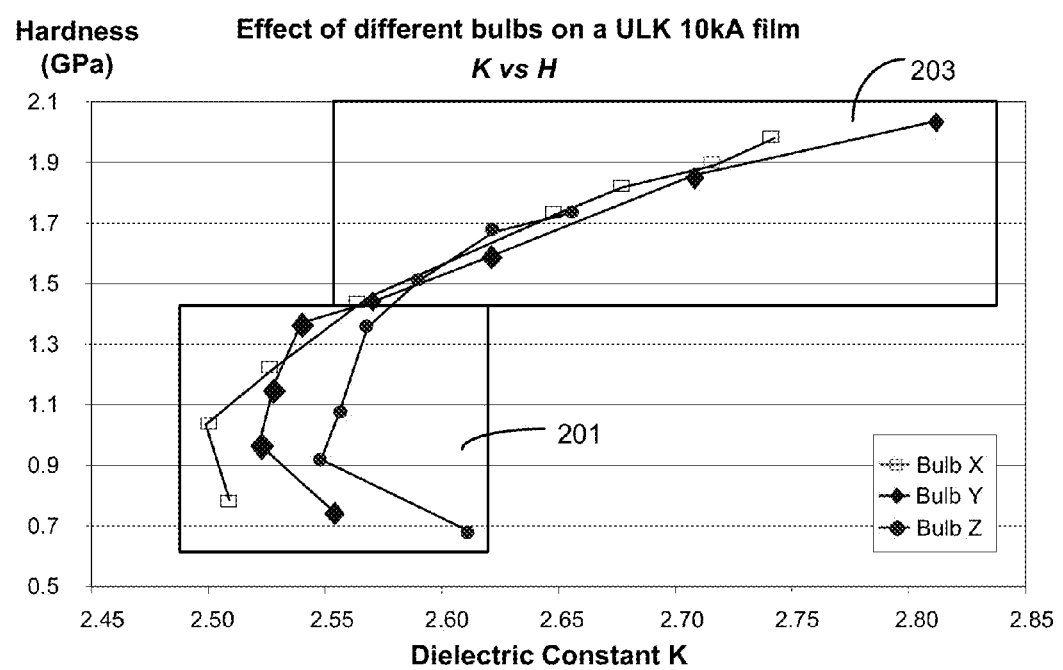
FIG. 2 is a graph showing the relationship between hardness and dielectric constant of a ULK film exposed with different UV bulbs.

FIG. 2 is a hardness (H) versus dielectric constant (K) graph for a typical film during UV exposure under a constant radiation source and constant chamber conditions, e.g., pressure and substrate temperature. Hardness versus dielectric constant data were plotted for three different UV radiation bulbs: X, Y, and Z. Each bulb generates radiation of a different UV spectrum. FIG. 2 shows that while the initial portion of the curve (area 201) differs on the various bulbs, all of them eventually follow the same curve (area 203). FIG. 2 suggests that, for a given set of chamber conditions, the same hardness for a target dielectric constant value is obtained regardless of the type of UV bulb used. Note that the amount of exposure time to reach the same hardness or dielectric constant may differ greatly depending on the reaction rates. Generally, bulbs with higher intensity at shorter wavelengths are faster to achieve the target hardness. However, in some cases the target hardness is achieved with a price in backbone content because of reaction 8. When reaction 8 is promoted, more methyl group is consumed to achieve the same target hardness. The reduction in backbone content increases the likelihood of etch damage and loss of critical dimension during wet treatment.

According to various embodiments of the present invention, the curves of area 201 and 203 are separately manipulated to yield desired dielectric constants while maximizing desirable mechanical properties to cure the film in least amount of time. By varying certain chamber conditions and UV radiation conditions, the final film properties and total process time may be fine-tuned for the device to be manufactured. One skilled in the art would be able to design a UV cure process to satisfy various design requirements while maximizing desirable properties and/or minimizing process time, depending on priorities.

During the initial curve (area 201), the differences in hardness versus dielectric constant behavior are believed to stem from the different reaction rates of the various reaction mechanisms described above. The initial drop in dielectric constant is attributed to porogen removal, most of which happens early during the cure. As rates of porogen removal decreases the silanol reduction resulting in oxygen-based cross-linking increases with a concomitant increase in the some carbon-based cross-linking reactions. The relative rates of these reactions determine the shape of the curve. For example, if a bulb emits radiation that enables both reactions to occur faster, then the dielectric constant begins to increase sooner than if a bulb that favors the oxygen-based cross-linking reactions were used.

According to various embodiments of the present invention, a more desirable initial curve is obtained by a first UV exposure of radiation that does not have the shorter wavelengths, e.g., shorter than about 240 nm. When the initial curve is thus obtained, porogen removal and oxygen-based cross-linking is promoted while shrinkage and methyl loss is minimized. The preferential porogen removal decreases the dielectric constant. The minimized shrinkage prevents the film from collapsing, the effect of which would hinder other reactions. The increased oxygen-based cross-linking (Si—O—Si bonds) is achieved through silanol reduction and increases hardness, as discussed. The methyl loss is minimized because the undesirable reaction 8 that requires a high energy photon is not promoted.

The hardness and dielectric constant at the end of the first radiation exposure is also dependent on substrate temperature. By curing at a higher substrate temperature, e.g., at about 450° C., lower dielectric constant and higher hardness may be achieved at the end of the first UV exposure than if a lower substrate temperature is used. Of course, the higher substrate temperature may be constrained by the substrate thermal budget. It is believed that the higher substrate temperature allows the porogen to completely diffuse out of the film and at a higher rate. The UV intensity also affects the film properties. A lower UV intensity is found to lower the dielectric constant even further. It is believed that a lower intensity reduces the cross-linking reaction rates while allowing the porogen breakdown and removal reaction to complete. Better film mechanical properties are also obtained by using a lower chamber pressure. The lower chamber pressure may facilitate removal of diffused porogen. For the first UV cure duration, higher substrate temperature, lower UV intensity, and lower chamber pressure are found to yield the lowest dielectric constant and maximize hardness.

Curing with this first UV radiation exposure continues until the lowest dielectric constant is achieved, or the dielectric constant starts to increase. This transition may be determined by depositing a ULK film on a number of substrates and exposing the substrates to UV radiation as described for different durations. At the end of the exposure the dielectric constants of the substrates are measured. The exposure duration corresponding to the lowest dielectric constant is the transition, or end point, for curve 201. If more than one durations correspond to the lowest dielectric constant, the duration that corresponds to the hardest film should be selected. As shown on FIG. 2, the point at which this transition takes place may be different from bulb to bulb and may be different from ULK film to ULK film. Thus the duration for the first exposure is determined on a case-by-case basis.

In the second UV exposure operation, shown as curve of area 203, dielectric constant increases with hardness. In this regime, the carbon-based cross-linking reactions dominate. The UV radiation spectrum in this region is determined based on trade-offs between process duration, substrate temperature, hardness, and film hydrophobicity. Generally, the UV radiation preferably includes only wavelengths of about 185 nm or longer.

As discussed above, the H versus k behavior of this second UV exposure does not change based on the UV spectrum as long as only wavelengths longer than about 185 nm is used. If the UV spectrum includes high intensity at wavelengths shorter than about 185 nm, the slope of the H versus k curve is affected. Reaction 8 requires high-energy photons and increases the film dielectric constant without a corresponding increase in hardness. In fact, the Si—H bond created in reaction 8 contributes to film stress. Thus, using a UV radiation including wavelengths shorter than about 185 nm can reduce the film hardness for a particular dielectric constant. On the other hand, using shorter wavelength radiation decreases processing time to a particular dielectric constant. If only low energy photons are used, e.g., by using a cut-off filter, the increase in hardness to a desired level may take hours. This slow reaction rate at long UV wavelengths is explained by a low reaction rate of reaction 7, which requires high-energy photons and contributes to film hardness. Overall, in this second UV exposure UV radiation having wavelengths of about 185 nm and longer is preferred to allow carbon-based cross-linking without promoting reaction 8 to a high level. This UV radiation may include wavelengths very close to 185 nm to minimize cure time.

In this regime, substrate temperature does not impact the shape or location of the curve but does impact reaction time. A higher substrate temperature at this stage reduces the cure time because the reaction rate is higher. However, thermal budget considerations may constrain the use of high substrate temperatures.

The duration of the second UV exposure is determined by exposing a number of films that were previously exposed to the first UV radiation. Each film is exposed to the second UV radiation for different durations under the same chamber conditions. Each film is then tested for the desired dielectric constant or material property, e.g., hardness or stress. The process duration of the film having the most desirable properties is then selected. The desirable property may be the minimum dielectric constant or hardness.

Apparatus

The present invention can be implemented in many different types of apparatus. Generally, the apparatus will include one or more chambers (sometimes referred to as process reactors) that house one or more substrates and are suitable for semiconductor processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g., rotation, vibration, or other agitation) during UV treatment operations.

In certain embodiments, the processing tool may include only one chamber having one or two processing stations. Wafer may or may not move sequentially from processing at one station to the other. At one station, the wafer may be exposed sequentially to one or more UV radiation sources designed to irradiate the surface substantially uniformly. When more than one UV radiation sources is used, they may be configured to emit UV radiation having different characteristics, e.g., wavelength distribution and intensity. Using different radiation sources allows a configuration of only one station in one chamber.

According to various embodiments, the processing tool includes a set of individual chambers. A wafer is loaded from a wafer cache to a first chamber. The wafer cache may be a FOUP, a load lock, or any wafer storage unit. In the first chamber, the wafer is exposed to UV radiation with characteristics selected for a first process. This first process may be to dissociate porogen while minimizing cross-linking. Once the wafer has finished processing in the first chamber, it is moved to a second chamber where it undergoes a second process. The second process may differ from the first process by one or more exposure characteristics, such as UV intensity, substrate temperature, exposure duration, spectral distribution, wavelengths, station pressure, and purge gas flows.

In certain embodiments the multi-operation cure process is performed using a multi-station cure chamber. As discussed above, in certain embodiments, the multiple operation cure processes of the invention rely on being able to independently modulate the UV intensity, wavelength, exposure duration, spectral distribution and substrate temperature of each step or operation. Additionally, certain inert or reactive gases may be injected during the cure process at the same or different flowrates at each step. For example, in one embodiment, the first UV exposure duration uses a lower UV intensity and a higher substrate temperature than the second UV exposure operation. In another embodiment, the first UV exposure operation uses a same substrate temperature and a lower UV intensity than the cross-linking operation. Similarly, various effects of UV exposure (porogen removal, change in stress, change in hardness, process time, etc.) may be modulated by independently modulating UV intensity and substrate temperature.

Multi-station cure chambers capable of modulating these effects by providing independent control of the substrate temperature and the UV intensity are described in above-referenced U.S. patent application Ser. No. 11/115,576 and in commonly assigned U.S. patent application Ser. No. 11/184,101, filed Jul. 18, 2005, titled "Cast Pedestal With Heating Element and Coaxial Heat Exchanger," which is hereby incorporated by reference in its entirety and for all purposes.

These chambers decouple substrate temperature and UV intensity by reducing the amount of IR radiation on the substrate and providing independent heat transfer mechanisms to and from the substrate. For example, the power to the radiation source may be adjusted or the chambers may be equipped with cold mirrors or other reflectors to reduce the amount of IR radiation incident on the substrate. In addition, each pedestal or other substrate support may have an independent heat transfer mechanism to help maintain a substrate temperature regardless of the UV intensity. Thus, unlike conventional UV cure chambers where substrate temperature is coupled to UV intensity, the substrate temperature and UV intensity may be independently set for a wide range of temperatures and intensities.

Figure 3A:
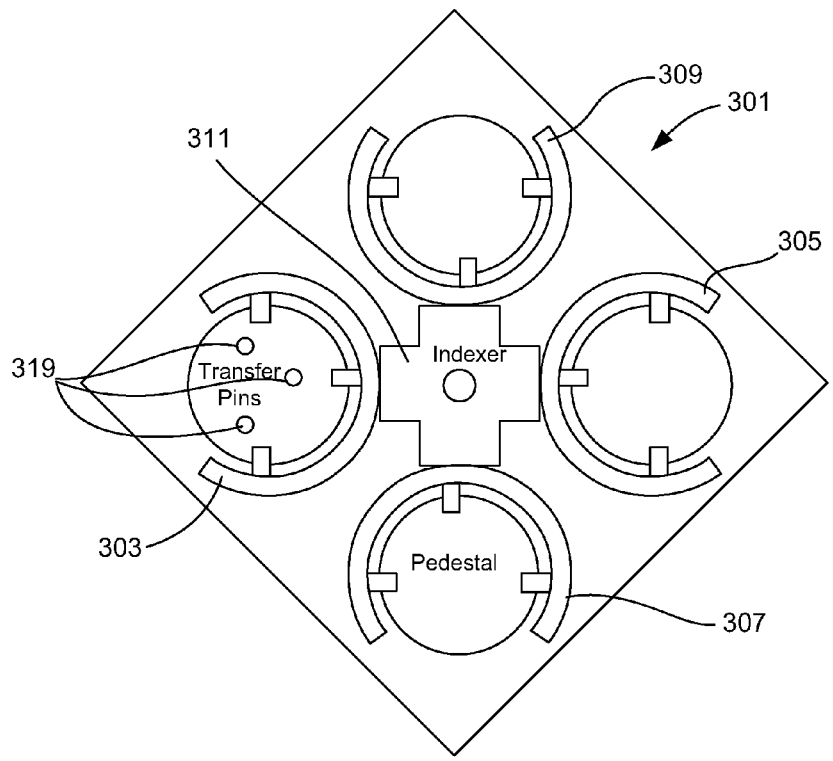
FIGS. 3 A and B are schematic representations of an apparatus suitable for UV porogen removal in accordance with certain embodiments of the present invention.
Figure 3B:
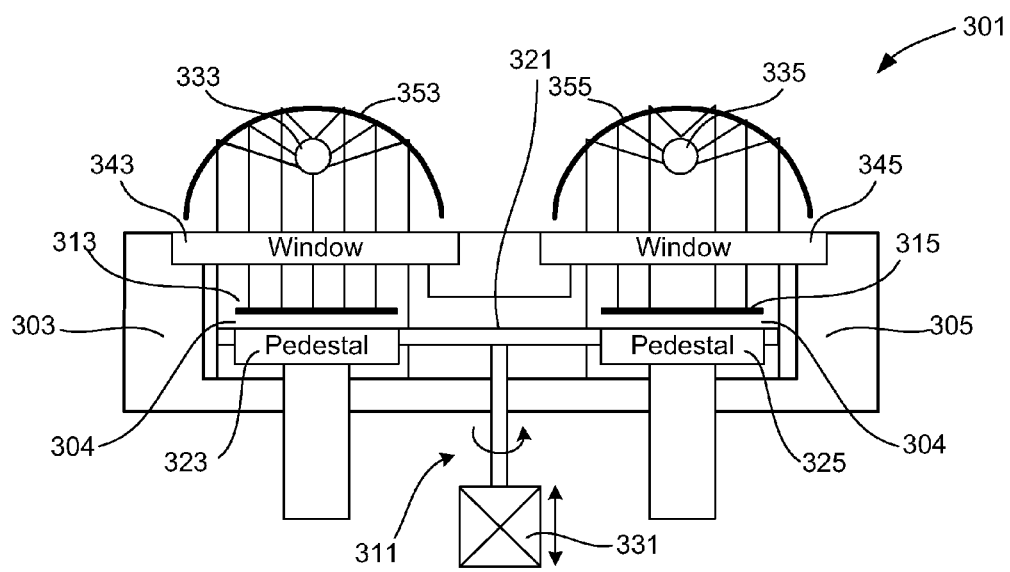

FIGS. 3A and 3B show one embodiment of an apparatus appropriate for use with certain embodiments of the invention. Chamber 301 includes multiple cure stations 303, 305, 307 and 309, each of which accommodates a substrate. Each station includes transfer pins 319, shown in figure only on station 303. FIG. 3B is a side view of the chamber showing stations 303 and 305 and wafers 313 and 315 located above pedestals 323 and 325. There are gaps 304 between the wafers and the pedestals. The wafer may be supported above the pedestal by an attachment, such as a pin, or floated on gas. The lamps may be equipped with parabolic or planar cold minors 353 and 355, which are located above UV flood lamp sets 333 and 335. UV light from lamp sets 333 and 335 passes through windows 343 and 345. Wafers 303 and 305 are then exposed to the radiation. In alternative embodiments, the wafer may be supported by the pedestals 323 and 325. The substrate temperature may be controlled by use of a conductive gas such as helium or a mixture of helium and argon at a sufficiently high pressure, typically between 50 and 760 Torr, but preferably between 100 and 600 Torr. The substrate temperature may also be controlled by the pedestal through an embedded heat exchanger, heater, or chiller.

In operation, a wafer (or other substrate) enters the chamber at station 303 where the porogen removal operation is performed. Pedestal temperature at station 303 is set to a first temperature, e.g. 400° C., with the UV lamps above station 303 set to a first intensity, e.g., 35% of maximum intensity. After the first UV exposure in station 303, the porous dielectric matrix is transferred to station 305 for the second UV exposure. Pedestal temperature at station 305 is set to a second temperature, e.g., 375° C. and UV intensity is set to a second intensity, e.g. 100%, or maximum intensity. Stations 307 and 309 may also be used for the second exposure. For example, conditions at stations 305, 307 and 309 may be the same. Each wafer is sequentially exposed to each UV light source. In other embodiments, the first two stations 303 and 305 are used for the first UV exposure and the next two stations 307 and 309 are used for the second exposure. In still other embodiments, no UV radiation is applied in the last station 309. Instead, the wafer is cooled.

Note that although the indexer transfers all the wafers to the next station at the same time, the exposure duration need not and, in many cases, should not be the same at each station. The UV radiation source or bulb may be programmed to turn on at different times. A particular feature of the present invention is the recognition that the optimal duration for each exposure operation may be different. While maximizing throughput may favor reducing non-exposure time in a station, exposing the substrates to each UV radiation for the same duration does not maximize the desirable mechanical properties. One skilled in the art would be able to determine the optimal durations based on the method described above and devise an exposure process using the multiple sequential exposure architecture to maximize throughput while exposing the substrates for the optimal durations.

Different stations may be configured to irradiate the wafer at different wavelengths or wavelengths ranges. The example above uses a UV flood lamp, which generates radiation in a broad spectrum. Optical components may be used in the radiation source to modulate the part of the broad spectrum that reaches the wafer. For example, reflectors, filters, or combination of both reflectors and filters may be used to subtract a part of the spectrum from the radiation. One such filter is a bandpass filter.

Optical bandpass filters are designed to transmit a specific waveband. They are composed of many thin layers of dielectric materials, which have differing refractive indices to produce constructive and destructive interference in the transmitted light. In this way optical bandpass filters can be designed to transmit a specific waveband only. The range limitations are usually dependant upon the interference filters lens, and the composition of the thin-film filter material. Incident light is passed through two coated reflecting surfaces. The distance between the reflective coatings determines which wavelengths will destructively interfere and which wavelengths will be allowed to pass through the coated surfaces. In situations where the reflected beams are in phase, the light will pass through the two reflective surfaces. However, if the wavelengths are out of phase, destructive interference will block most of the reflections, allowing almost nothing to transmit through. In this way, interference filters are able to attenuate the intensity of transmitted light at wavelengths that are higher or lower than the desired range.

Another filter that can attenuate the wavelengths of the radiation reaching the wafer is the window 343, typically made of quartz. By changing the level of metal impurities and water content, the quartz window can be made to block radiations of undesired wavelengths. High-purity Silica Quartz with very little metal impurity is more transparent deeper into the ultraviolet. As an example, quartz with a thickness of 1 cm will have a transmittance of about 50% at a wavelength of 170 nm, which drops to only a few percent at 160 nm. Increasing levels of impurities in the quartz cause transmission of UV at lower wavelengths to be reduced. Electrically fused quartz has a greater presence of metallic impurities, limiting its UV transmittance wavelength to around 200 nm. Synthetic silica, on the other hand, has much greater purity and will transfer down to 170 nm. Thus, the spectrum of radiation transmission through the quartz window may be controlled to cutoff or reduce UV transmission at shorter wavelengths.

Another type of filter is UV cut-off filters or low pass filters. These filters do not allow UV transmission below a set wavelength or above a certain frequency, e.g. 280 nm. These filters work by absorbing wavelengths below the cut-off value. This may be helpful to optimize the desired cure effect.

Radiation wavelength can also be controlled by modifying the properties of the light generator. UV flood lamps can generate a broad spectrum of radiation, from UV to infrared, but other light generators may be used to emit a smaller spectrum or to increase the intensity of a narrower spectrum. Other light generators may be mercury-vapor lamps, doped mercury-vapor lamps, electrode lamps, excimer lamps, excimer lasers, pulsed Xenon lamps, doped Xenon lamps, noble gas lamps (e.g., argon lamps), metal halide lamps (e.g., HgI lamps, RF driven lamps (e.g., inductively and capacitively coupled lamps), DC lamps. Lasers such as excimer lasers can emit radiation of a single wavelength. When dopants are added to mercury-vapor and to Xenon lamps, radiation in a narrow wavelength band may be made more intense. Common dopants are iron, nickel, cobalt, tin, zinc, indium, gallium, thallium, antimony, bismuth, or combinations of these. For example, mercury vapor lamps doped with indium emits strongly in the visible spectrum and around 450 nm; iron, at 360 nm; and gallium, at 320 nm. Radiation wavelengths can also be controlled by changing the fill pressure of the lamps. For example, high-pressure mercury vapor lamps can be made to emit wavelengths of 250 to 440 nm, particularly 310 to 350 nm more intensely. Low-pressure mercury vapor lamps emit at shorter wavelengths.

In addition to changing light generator properties and the use of filters, reflectors that preferentially deliver one or more segments of the lamps spectral output may be used. A common reflector is a cold minor that allows infrared radiation to pass but reflects other light. Other reflectors that preferentially reflect light of a spectral band may be used. Therefore a wafer may be exposed to radiation of different wavelengths at different stations. Of course, the radiation wavelengths may be the same in some stations.

In FIG. 3B, pedestals 323 and 325 are stationary. Indexer 311 lifts and moves each wafer from one pedestal to another between each exposure period. Indexer 311 is an indexer plate 321 attached to a motion mechanism 331 that has rotational and axial motion. Upward axial motion is imparted to indexer plate 321 to pick up wafers from each pedestal. The rotational motion serves to advance the wafers from one station to another. The motion mechanism then imparts downward axial motion to the plate to put the wafers down on the stations.

Pedestals, e.g., 323 and 325, are temperature controlled to maintain a desired substrate temperature. Each pedestal may include its own heating and cooling system. The system may include a heat exchanger, or a heater and a chiller. In an alternate embodiment, a large heater block may be used to support the wafers instead of individual pedestals. A thermally conductive gas, such as helium, is used to effect good thermal coupling between the pedestal and the wafer. In some embodiments, cast pedestals with coaxial heat exchangers may be used. These are described in above-referenced application Ser. No. 11/184,101.

FIGS. 3A and 3B show only an example of a suitable apparatus and other apparatuses designed for other methods involved in previous and/or subsequent processes may be used. For example, in another embodiment that uses flood lamps, the wafer support is a carousel. Unlike with the stationary pedestal wafer supports, the wafers do not move relative to the carousel. After a wafer is loaded onto the carousel, the carousel rotates, if necessary, to expose the wafer to light from a UV lamp set. The carousel is stationary during the exposure period. After the exposure period, the carousel rotates to advance each wafer for exposure to the next set of lamps. Heating and cooling elements may be embedded within the rotating carousel. Alternatively the carousel may be in contact with a heater plate or hold the wafers so that they are suspended above a heater plate.

In certain embodiments, the substrates are exposed to UV radiation from focused, rather than, flood lamps. Unlike the flood lamp embodiments wherein the wafers are stationary during exposure (as in FIGS. 3A and b), there is relative movement between the wafers and the light sources during exposure to the focused lights as the wafers are scanned.

Other apparatuses designed for other methods involved in previous and/or subsequent processes may be used. For example, methods of the invention may be used with a standard PECVD chamber used to deposit the precursor layer if the chamber is equipped with a UV radiation source. Many of these systems may also be used to perform post-porogen removal procedures. In these cases, the chamber system will likely be pumped out between each of the process operations.

Examples

Example processes in accordance with the present invention are discussed below. The example processes list parameters of substrate temperature, UV intensity as percentage of full power, desired spectral band as a wavelength range, station pressure, and gas flow rate for each of stations one to four for a four-station chamber. These example processes are suitable for use in a Novellus SOLA, which uses a four-station sequential processing chamber. These example processes may also be suitable for use in other semiconductor processing equipment, such as ones that use multiple chambers or multi-stations chambers with fewer or more than four stations.

In the example, wafers having a porous ULK film deposited thereon are treated with UV radiation in four different exposure sequences. The ULK films are deposited to a 10000 angstrom thickness. All four films were first exposed for 20 minutes to a UV source that does not emit radiation in the shorter wavelengths below about 240 nm. For two of the films, the first exposure was optimized with a low pressure at 10 Torr and low UV intensity at about 35% of maximum, which may be about 200 mW/cm$^2$ to 400 mW/cm$^2$ in the desired spectral band. In the second exposure these two films were exposed to different UV sources. In one case the source was the same as that of the first exposure, and in the other case the source is a different UV bulb, bulb A, that emitted higher intensity in the shorter wavelengths, down to about 185 nm. The resulting hardness versus dielectric constant plot is shown as FIG. 4. Table 1 describes the exposure sequences of each of the lines shown.

TABLE 1

Figure 4:
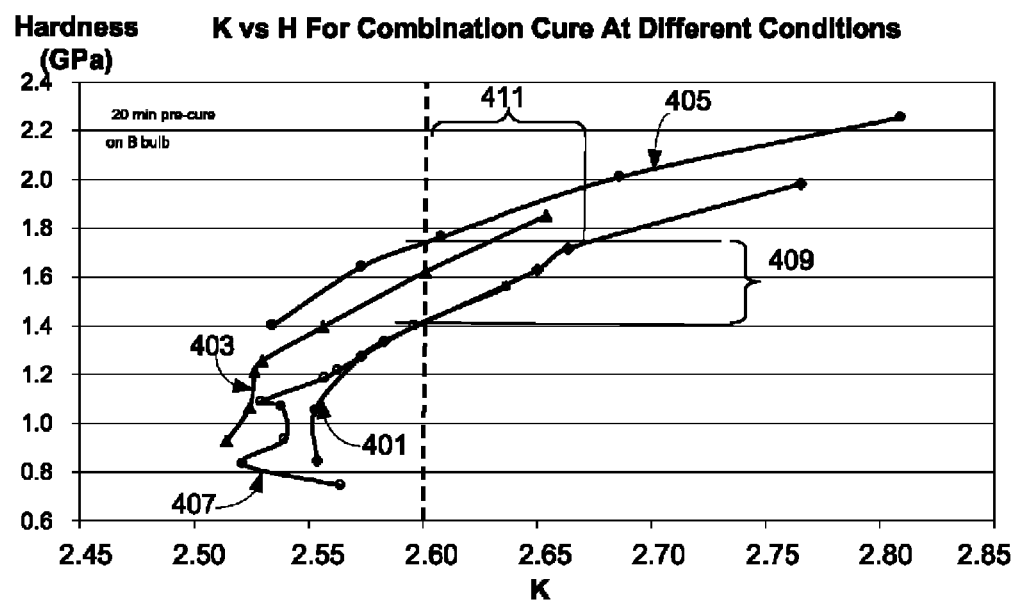
FIG. 4 is a graph of hardness versus dielectric constant of ULK films cured under different conditions in accordance with various embodiments of the present invention.

UV Exposure Sequence for Combination Cure for FIG. 4

| Parameter/Line | 401 | 403 | 405 | 407 |
|---|---|---|---|---|
| First Exposure Wavelengths | 20 minutes under UV Bulb B not including shorter wavelengths below about 240 nm | | | |
| First Exposure Conditions | Not Optimized | Optimized | Optimized | Not Optimized |
| Second Exposure | UV Bulb A | UV Bulb B | UV Bulb A | UV Bulb B |

In each of the cases, the hardness and k start out low and increases together. After the dielectric constant increases past about 2.6, the curves are relatively linear. Note that each of the data points on the plot were measured after a different second exposure duration. For example, the data point of curve 405 representing the highest hardness (about 2.25 GPa) and k was measured after 60 minutes of cure time, and the data point representing the lowest hardness (about 1.4 GPa) and k was measured after about 20 minutes of cure time.

Curve 407 shows the case of using the same bulb for both exposures under same exposure conditions. The dielectric constant decreases initially and then increases to overlap a part of the curve 401, which had the same initial exposure lamp but a different second exposure lamp. This overlap is consistent with the theory that hardness versus k curve does not change during the second exposure when the initial UV exposure conditions are the same. Curves 403 and 405 were subjected to optimized initial cure conditions as described above. While the slopes of the curves remained the same, curves 403 and 405 are shifted above curves 401 and 407. This shows that a harder film at the same dielectric constant may be obtained by optimizing initial cure conditions. The increase in hardness, bracket 409 in FIG. 4, between curves 401 and 405 at a dielectric constant of 2.6, is 24%. For films where maximizing hardness at a maximum dielectric constant is important, the methods of the present invention can yield significant (up to at least 24%) improvements. Another way to view the results is to find the decrease in dielectric constant for the same hardness. In some cases minimizing dielectric constant at a minimum hardness is important, the comparison between line 405 and 401 shows a decrease of 3% in dielectric constant at a hardness of about 1.75 GPa. A bracket 411 indicates the shift in dielectric constant for the same hardness.

Figure 5:
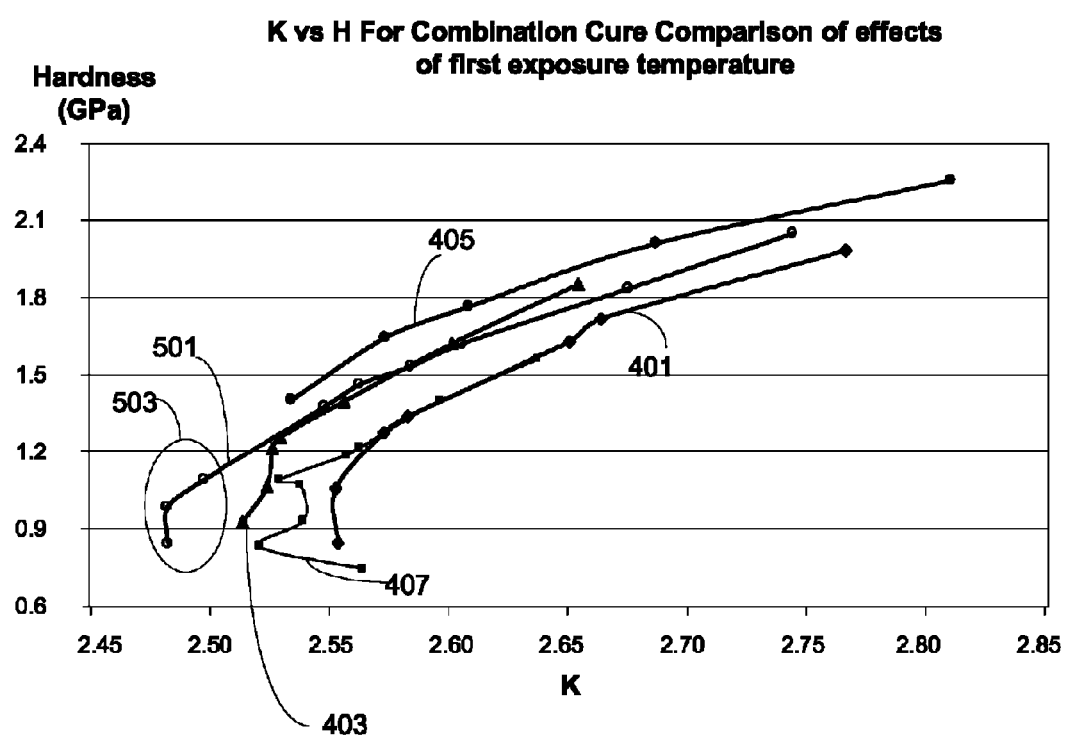
FIG. 5 is a graph of hardness versus dielectric constant of ULK films cured under different conditions in accordance with various embodiments of the present invention.

In another example, the effect of substrate temperature during the first UV exposure is shown. In this example, shown in FIG. 5, an additional curve 501 was added to the data from FIG. 4. The lines from FIG. 4 retain their labels on FIG. 5. Curve 501 is obtained by an initial UV exposure at 450° C. using bulb B throughout the exposure sequence.

Curve 501 demonstrates the effect of a higher substrate temperature during the initial UV cure. A segment 503 of the curve shows lower dielectric constants and higher hardness than all other curves. It is believed that a higher initial substrate temperature aids the rates and completion of the reactions associated with the first UV exposure operation. Curve 407 shows the hardness versus dielectric constant behavior for a film cured using the same bulb at 400° C. A comparison of curve 501 and 407 shows that a harder film at the same dielectric constant was obtained by changing the substrate temperature during the first cure stage. Thus a film with better mechanical properties may be obtained by increasing the substrate temperature during the first UV exposure. These results indicate potential for even further improvements by combining the optimized conditions and higher first stage substrate temperature.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of UV curing a dielectric film on a substrate, the method comprising:
   (a) exposing the dielectric film on the substrate to first UV radiation having a first wavelength or first wavelength range, said first wavelength or first wavelength range including only wavelengths longer than about 220 nm, until porogens in the dielectric film are removed, thus reducing a dielectric constant of the dielectric film, and then further exposing the dielectric film to the first UV radiation after the porogens are removed to further reduce the dielectric constant of the dielectric film; and
   (b) after (a) exposing the dielectric film to second UV radiation having a second wavelength or second wavelength range, said second wavelength or second wavelength range including only wavelengths of 185 nm or longer, until a desired film material property is reached, wherein the second wavelength or lowest wavelength of the second wavelength range is lower than the first wavelength or lowest wavelength of the first wavelength range.

2. The method of claim 1, wherein the desired film material property is hardness.

3. The method of claim 1, wherein the desired film material property is elastic modulus.

4. The method of claim 1, wherein the desired film material property is fracture resistance.

5. The method of claim 1, wherein the exposure to the first UV radiation promotes porogen outgassing and, during and after porogen outgassing, linking of silicon and oxygen atoms in the dielectric film.

6. The method of claim 1, wherein the exposure to the second UV radiation promotes linking of silicon and carbon atoms in the dielectric film.

7. The method of claim 1, where a temperature of the substrate during the first UV radiation exposure is higher than a corresponding temperature of the substrate during the second UV radiation exposure.

8. The method of claim 1, wherein the exposure to the first UV radiation and the second UV radiation occur in the same chamber.

9. The method of claim 8, wherein the exposure to the first UV radiation and the second UV radiation occur at a same substrate exposure area.

10. The method of claim 8, wherein the exposure to the first UV radiation and the second UV radiation occur at different substrate exposure areas.

11. The method of claim 1, wherein the first wavelength range is 220 nm to 280 nm.

12. The method of claim 1, wherein the first UV radiation has only wavelengths longer than about 240 nm.

13. The method of claim 1, wherein the exposure to the first UV radiation occurs at a substrate temperature of 400° C. or higher.

14. The method of claim 1, wherein the first wavelength range is between about 250 nm to 270 nm and the second wavelength range is between about 225 and 240 nm.

15. The method of claim 1, wherein the dielectric constant of the dielectric film starts to increase when dielectric constant-lowering reactions are outweighed by dielectric constant-raising reactions.

16. The method of claim 15, wherein the dielectric constant-lowering reactions are silicon-oxygen crosslinking reactions and the dielectric constant-raising reactions are silicon-carbon crosslinking reactions.

17. A method of UV curing a dielectric film on a substrate, the method comprising:
   (a) exposing the dielectric film for a first duration to first UV radiation to thereby outgas porogens from the dielectric film and thereby lower a dielectric constant of the dielectric film and, during and after the porogen outgassing, link silicon-oxygen bonds to further lower the dielectric constant of the dielectric film; and
   (b) exposing the dielectric film for a second duration to second UV radiation to thereby link silicon-carbon bonds within the dielectric film, wherein the UV radiation in each exposure operation has a wavelength or a wavelength range and wherein the wavelength or lower limit of the wavelength range is decreased with successive exposures.

18. The method of claim 17, where a temperature of the substrate during the first UV radiation exposure is equal to or higher than a corresponding temperature of the substrate during the second UV radiation exposure.

19. The method of claim 17, wherein the first UV radiation exposure occurs at a substrate temperature of 400° C. or higher.

20. The method of claim 17, wherein the first UV radiation has a wavelength range of between about 250 nm and 270 nm, and wherein the second UV radiation has a wavelength range of between about 225 nm and 240 nm.

21. A method of determining UV curing parameters for a dielectric film, the method comprising:

(a) depositing the dielectric film on a plurality of substrates;
(b) exposing each substrate to first UV radiation having only wavelengths longer than about 220 nm for different durations from 1 minute to 20 minutes, wherein the duration of at least one of the first UV radiation exposures is long enough that (i) a dielectric constant of the dielectric film of at least one of the substrates is decreased by removing porogens in the dielectric film and (ii) there is a further decrease in the dielectric constant of the dielectric film after the porogens are removed;
(c) measuring a dielectric constant and hardness for each substrate;
(d) determining a first duration for a minimum dielectric constant;
(e) exposing the plurality of substrates to second UV radiation having only wavelengths of 185 nm or longer for different durations from 1 minute to 20 minutes;
(f) measuring the dielectric constant and hardness for each of the substrates; and
(g) determining a second duration at which at least one parameter is reached, the at least one parameter selected from the group consisting of: a target k value and a minimum hardness, wherein the UV radiation in each exposure operation (b) and (e) has a wavelength or a wavelength range and wherein the wavelength or lower limit of the wavelength range is decreased with successive exposures.

22. The method of claim 21, wherein the exposure to the first UV radiation operation occurs at a substrate temperature of 400° C. or higher.

23. The method of claim 21, wherein the UV radiation wavelength in the first exposure operation (b) is longer than about 240 nm.

24. A method of UV curing a dielectric film on a substrate, the method comprising:
(a) exposing the dielectric film to first UV radiation having only wavelengths longer than about 220 nm until porogens in the dielectric film are removed, thus lowering the dielectric constant of the dielectric film, and then further exposing the dielectric film to the first UV radiation after the porogens are removed to further lower the dielectric constant of the film; and
(b), after (a), exposing the film to second UV radiation comprising wavelengths of less than 200 nm until a desirable material property is reached, wherein a total exposure time needed to perform (a) and (b) is shorter than an exposure time needed for UV curing to the desirable material property with a constant radiation spectrum.

25. The method of claim 24, where a substrate temperature during the first UV radiation exposure is equal to or higher than a substrate temperature during the second UV radiation exposure.

* * * * *